US008500964B2

(12) United States Patent
Peng

(10) Patent No.: US 8,500,964 B2
(45) Date of Patent: Aug. 6, 2013

(54) METHOD OF FABRICATING BUBBLE-TYPE MICRO-PUMP

(75) Inventor: Chen Peng, Taipei (TW)

(73) Assignee: Benq Materials Corp., Taoyuan County (TW)

( * ) Notice: Subject to any disclaimer, the term of this patent is extended or adjusted under 35 U.S.C. 154(b) by 786 days.

(21) Appl. No.: 12/610,736

(22) Filed: Nov. 2, 2009

(65) Prior Publication Data

US 2010/0155230 A1 Jun. 24, 2010

(30) Foreign Application Priority Data

Dec. 19, 2008 (TW) ............................... 97149831 A

(51) Int. Cl.

| | |
|---|---|
| ***C23C 14/00*** | (2006.01) |
| ***C23C 14/32*** | (2006.01) |
| ***F17D 1/16*** | (2006.01) |
| ***F17D 1/18*** | (2006.01) |
| ***F15C 1/04*** | (2006.01) |

(52) U.S. Cl.
USPC .............. 204/192.15; 204/192.1; 204/192.12; 137/13; 137/825

(58) Field of Classification Search
USPC ............... 204/192.1, 192.12, 192.15; 137/13, 137/825
See application file for complete search history.

(56) References Cited

U.S. PATENT DOCUMENTS

| | | | | |
|---|---|---|---|---|
| 6,130,098 | A * | 10/2000 | Handique et al. | 436/180 |
| 6,533,951 | B1 * | 3/2003 | Debar et al. | 216/27 |
| 7,004,184 | B2 * | 2/2006 | Handique et al. | 137/1 |
| 2005/0189225 | A1 * | 9/2005 | Liu et al. | 204/600 |
| 2007/0065308 | A1 * | 3/2007 | Yamamoto et al. | 417/413.1 |

* cited by examiner

*Primary Examiner* — Michael Band
(74) *Attorney, Agent, or Firm* — McClure, Qualey & Rodack, LLP

(57) ABSTRACT

A manufacturing method of a bubble-type micro-pump is provided. At least a bubble-generating unit is provided on the bubble-generating section. Because of the varied surface energies on the top of the bubble-generating section, the varied backfilling velocities of the fluid of the front end and the rear end cause fluid moving when a bubble vanishes. The top surface of the bubble-generating section is subjected to a particular surface treatment to form a surface energy gradient. Examples of surface treatment include sputtering a thin film with varied densities or thickness, radiating one or multi-layer thin films by a laser beam, etc.

7 Claims, 5 Drawing Sheets

METHOD OF FABRICATING BUBBLE-TYPE MICRO-PUMP

This application claims the benefit of Taiwan application Serial No. 97149831, filed Dec. 19, 2008, the subject matter of which is incorporated herein by reference.

BACKGROUND OF THE INVENTION

1. Field of the Invention

The invention relates in general to a method of fabricating a bubble-type micro-pump, and more particularly to a method of fabricating an electrolysis bubble-type micro-pump applied to a microfluidic chip.

2. Description of the Related Art

As the technology continues to evolve, the application of microfluidic chip is brought out in recent years. Generally speaking, a microfluidic chip roughly includes a fluidic channel and a fluid-dynamic mechanism. The design of micro-pump especially plays an important role in the movement of the fluid.

The detailed design, operating principle and various application fields can be found in many research documents and journals. For example, in "droplet movement on horizontal surface with gradient surface energy" disclosed in Science in China, volume 37, page 402-408 (2007), dodecyltrichlorosilane is used on silicon substrate to form a surface with gradient surface energy by chemical vapor deposition. The U.S. Pat. No. 6,231,948 reveals a pervious web to rapidly transport fluid away from the contacting surface toward another surface. The U.S. Pat. No. 6,232,521 reveals a low surface energy material applied to a back sheet of sanitary napkin to form a hydrophobic gradient between the back sheet and the core, which reduces leakage. A similar U.S. Pat. No. 5,658,639, reveals a non-woven web having the opposite first and the second surfaces. Several channels are used for transporting liquid. When liquid contacts the first surface with lower surface energy, the surface energy gradient drives the liquid to flow toward the second surface. Therefore, the web is suited for use as a top sheet of a sanitary napkin. Furthermore, the U.S. Pat. No. 5,792,404 reveals a method for forming surface energy gradients. Several three-dimensional raised rib-like portions are produced to increase the caliper of the non-woven web, so that fluid can flow away from the wearer-contacting surface and into the absorbent structure.

The design of micro-pump can be divided into two types according to the driving principle of the fluid. One is to drive fluid through mechanical method, such as bubble pump, membrane pump, diffuser pump, etc. These pumps use the mechanical elements to drive fluid. The other one is to drive fluid through induced electric field, such as electro-osmotic pump, electrophoretic pump, electro-wetting pump, etc. Fixed electrodes are formed in these pumps, and electric field is generated to drive fluid after voltage is applied.

It is an object to overcome the limitations of the process and to fabricate a microfluidic chip, such as a micro-pump, with precision structure and high-precision flow-rate control while controlling the manufacture cost to meet the demand of mass production.

SUMMARY OF THE INVENTION

The invention is directed to a method of fabricating a bubble-type micro-pump. Variation of the material, density, thickness or surface roughness is formed by sputtering or a laser beam in order to form a surface energy gradient on the top surface in the bubble-generating section of the micro-channel. As a result, the manufacturing process is simplified, and the manufacturing cost is lowered.

According to the present invention, a method of fabricating a bubble-type micro-pump is provided. The method includes following steps. First, a micro-channel having a top surface, a bottom surface and two side walls is provided. The micro-channel has at least a bubble-generating section. Next, a bubble-generating unit is provided in the bubble-generating section of the micro-channel for generating a bubble in a liquid between the front end and the rear end of the bubble-generating section. Then, a surface treatment is applied to the top surface of the bubble-generating section to form a surface energy gradient. When a bubble vanishes, the backfilling velocity of the liquid toward the front end is different from that of the liquid toward the rear end due to the surface energy gradient on the top surface, which drives liquid to flow toward the front end or the rear end.

When surface treatment is applied to the top surface, at least two regions or parts with different surface energies are formed by sputtering or a laser beam for forming a surface energy gradient on the top surface in the bubble-generating section.

The invention will become apparent from the following detailed description of the preferred but non-limiting embodiments. The following description is made with reference to the accompanying drawings.

DETAILED DESCRIPTION OF THE INVENTION

Figure 1:
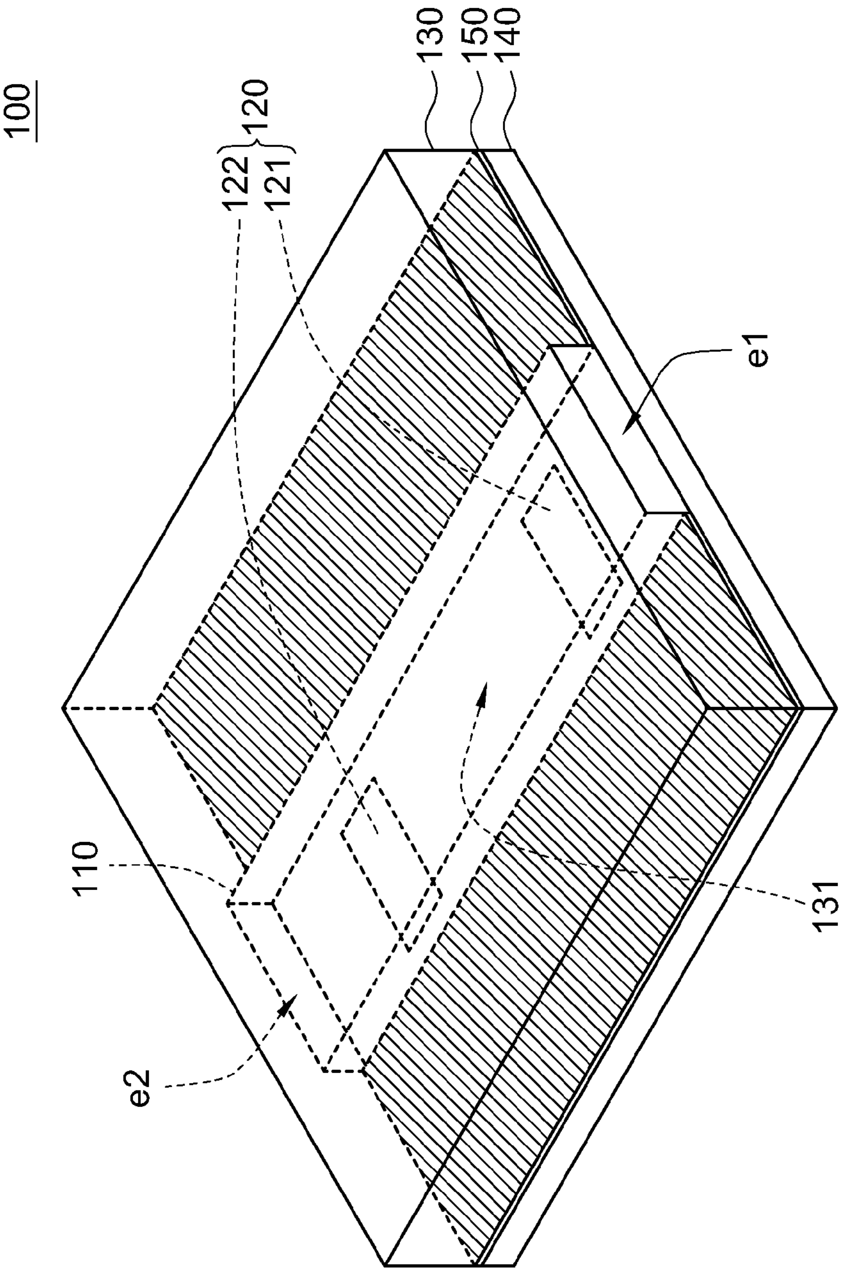
FIG. 1 illustrates a microfluidic chip according to the first embodiment of the present invention.

A method of fabricating a bubble-type micro-pump is provided by the present invention. According to the present invention, a micro-channel has a top surface, a bottom surface and two side walls. At least a bubble-generating unit is provided on the bottom surface for generating a bubble in a bubble-generating section of the micro-channel. The top surface has a surface energy gradient. When the generated bubble starts to vanish, the backfilling velocity of the liquid flowing toward the front end of the bubble-generating section is different from the backfilling velocity of the liquid flowing toward the rear end of the bubble-generating section. As a result, the fluid is driven to flow toward the front end or the rear end. The method of the present invention uses laser or sputtering method to form the surface energy gradient on the top surface of the micro-channel.

A microfluidic chip of a bubble-type micro-pump is provided as follows to illustrate the fabricating method of the present invention. However, the microfluidic chip in the drawings is used as an example. The present invention is not limited thereto. Furthermore, unnecessary elements are not shown in the drawings for clarity.

Figure 2:
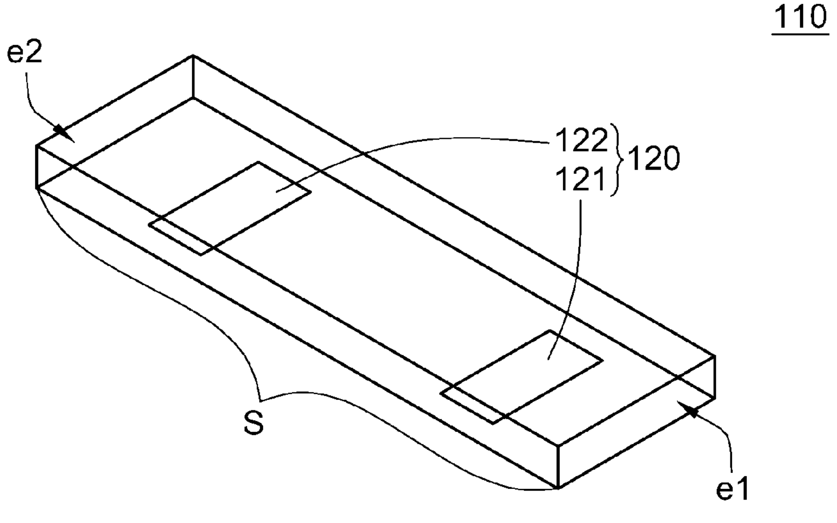
FIG. 2 illustrates the bubble-generating section of the micro-channel in FIG. 1.
Figure 3:
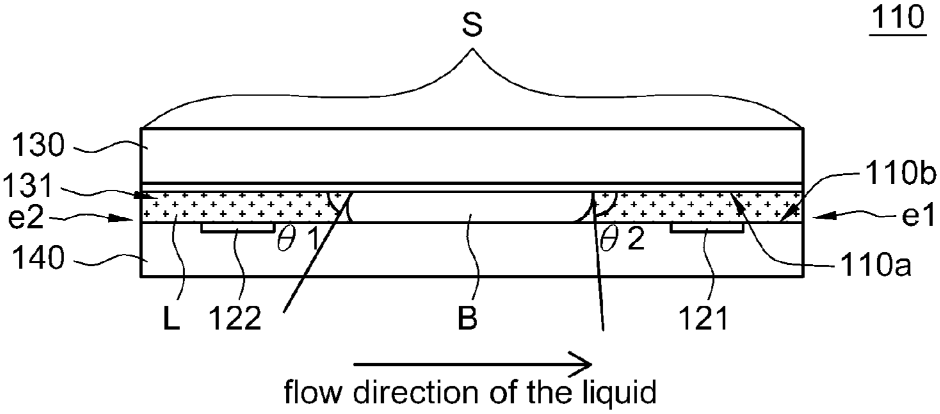
FIG. 3 is a side view of the bubble-generating section of the micro-channel in FIG. 2 when the pump operates.

FIG. 1 illustrates a microfluidic chip according to the present invention. FIG. 2 illustrates the bubble-generating section of the micro-channel in FIG. 1. FIG. 3 is a side view of the bubble-generating section of the micro-channel in FIG. 2 when the pump operates. Please refer to FIG. 1, FIG. 2 and FIG. 3 at the same time.

The microfluidic chip 100 includes a micro-channel 110 and a bubble-generating unit 120. The bubble-generating unit 120 includes the first electrode 121 and the second electrode 122. The first electrode 121 and the second electrode 122 are respectively adjacent to the front end e1 and the rear end e2 of the bubble-generating section S.

According to the operating principle of the bubble-type micro-pump, a contact angle is formed by the tension of the vapor-liquid-solid three-phase interface. The value of the contact angle is related to the surface wettability of the micro-channel. When the bubble B is generated in the bubble-generating section S, the wettability of the solid surface on both sides of the bubble is different due to a surface energy gradient formed on the top surface 110*a* of the bubble-generating section S, which results in varied contact angles. It is assumed herein that the contact angle θ1 is less than the contact angle θ2. As a result, when the bubble B vanishes (FIG. 3), the backfilling velocity of the liquid L toward the front end e1 is different from that toward the rear end θ2 due to capillary force, which drives the liquid to flow toward the side with slower backfilling velocity (namely, the right side). On the contrary, when the contact angle θ1 is larger than the contact angle θ2, the liquid flows toward the side with slower backfilling velocity (namely, the left side). Moreover, an electrode control circuit (not shown in the drawings) can be disposed on the second substrate 140 for controlling the electrodes 121 and 122 to generate the bubble B.

When the microfluidic chip 100 is fabricated, the first substrate 130 with a recess 131 and the second substrate 140 are provided respectively. The first substrate 130 and the second substrate 140 are bonded to each other by light cure adhesive or pressure sensitive adhesive. The surface of the recess 131 of the first substrate 130 forms the top surface 110*a* and the two side walls of the micro-channel 110. The surface of the second substrate 140 forms the bottom surface 110*b* of the micro-channel 110. The first electrode 121 and the second electrode 122 are disposed on the second substrate 140 and respectively adjacent to the front end e1 and the rear end e2 of the bubble-generating section S. The recess 131 of the first substrate 130 is preferably fabricated by low-cost injection molding, pressure casting or etching. The second substrate 140 having the first electrode 121 and the second electrode 122 is fabricated through PCB (printed circuit board) manufacturing process or MEMS (micro-electro-mechanical system) manufacturing process. Besides, the first substrate 130 and the second substrate 140 can be bonded to each other through the pressure sensitive adhesive with re-workability. When a defective product is generated in the manufacturing process, the pressure sensitive adhesive can be peeled off and re-fabricated to increase the yield rate. Even after the product is used, the substrates can be separated, cleaned and sterilized for recycling the costly second substrate 140. The second substrate 140 is reused for saving energy and protecting the environment.

The first electrode 121 and the second electrode 122 are used as the bubble-generating unit 120 in the embodiment. However, any one who has ordinary skills in the related field can understand that the present invention is not limited thereto. Other suitable bubble-generating devices can be provided in the bubble-generating section S of the micro-channel 110 for generating a bubble. Please refer to an essay "engineering surface roughness to manipulate droplets in microfluidic systems" (Ashutosh Shastry, etc, pp 694-697, 30 Jan.~3 Feb. 2005, IEEE) for the description of the bubble-type micro-pump.

Several modes of operation of the microfluidic chip of the present invention in FIG. 1 are provided as follows with reference to the accompanying drawings. The fabricating method can be mainly divided as sputtering method (the first embodiment) and laser method (the second to fourth embodiments) according to the present invention for forming the surface energy gradient on the top surface of the micro-channel. The structures and the fabricating steps of the micro-channel in the modes of operation are merely used as examples for illustrating the invention. Therefore, the embodiments disclosed herein are used for illustrating the invention, but not for limiting the scope of the invention. Furthermore, unnecessary elements are not shown in the drawings for clarity.

Forming a Surface Energy Gradient on the Top Surface of the Micro-Channel by Sputtering Method

First Embodiment

Figure 4:
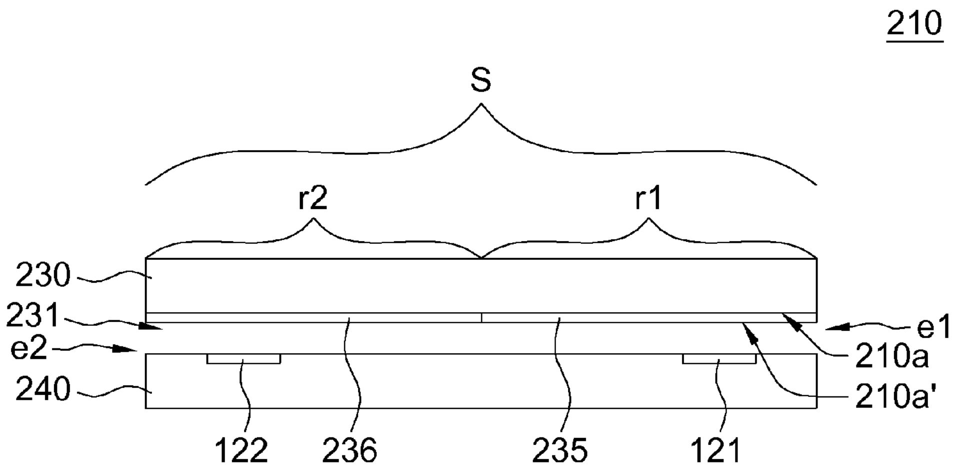
FIG. 4 is a side view of a micro-channel according to the first embodiment of the present invention.

Please refer to FIG. 4. FIG. 4 is a side view of a micro-channel according to the first embodiment of the present invention. The top surface of the bubble-generating section includes two films. In the fabricating method, a surface treatment is applied to the first substrate 230 before the first substrate 230 and the second substrate 240 are bonded to each other, so that the first film 235 is formed in the first region r1 of the top surface 210*a* adjacent to the front end e1 of the bubble-generating section S. Then, the second film 236 is formed in the second region r2 of the top surface 210*a* adjacent to the rear end e2 of the bubble-generating section S. The second film 236 adjacent to the rear end e2 connects to the first film 235 adjacent to the front end e1 so as to form the micro-channel 210 in FIG. 4. As shown in FIG. 4, the first film 235 and the second film 236 are deposited by sputtering method. The first surface energy of the first film 235 is different from the second surface energy of the second film 236 to form a surface energy gradient on the top surface 210*a'*.

Moreover, besides using different materials, the surface energy difference between the first film 235 and the second film 236 can be formed by using the same material. However, the first film 235 and the second film 236 have different thickness or sputtering density in order to form a surface energy gradient on the top surface 210*a'*. Therefore, selection and modification can be made in the practical manufacturing process according to the application conditions.

Figure 5:
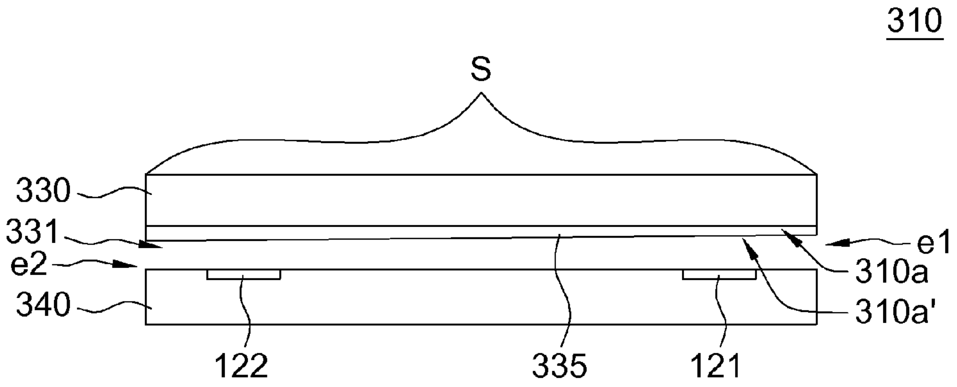
FIG. 5 is a side view of another micro-channel according to the first embodiment of the present invention.

Please refer to FIG. 5. FIG. 5 is a side view of another micro-channel according to the first embodiment of the present invention. The difference between FIG. 4 and FIG. 5 is that a single film 335 is formed by sputtering method on the top surface 310*a* in the bubble-generating section S of the first substrate 330 in FIG. 5. However, the thickness of the film 335 gradually increases or decreases from the front end e1 to the rear end e2. A surface energy gradient is formed on the top surface 310*a*' through the thickness variation of the film 335. The density of the film 335 remains constant.

Figure 6:
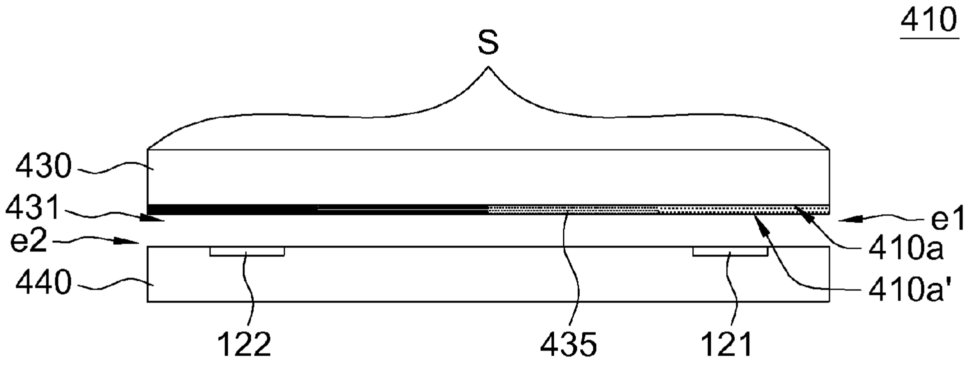
FIG. 6 is a side view of another micro-channel according to the first embodiment of the present invention.

Please refer to FIG. 6. FIG. 6 is a side view of another micro-channel according to the first embodiment of the present invention. The film 435 with the same thickness is deposited on the top surface 410*a* in the bubble-generating section S of the first substrate 430. The density of the film 435 increases or decreases from the front end e1 to the rear end e2. A surface energy gradient is formed through the density variation of the film 335.

In the above description, the surface energy gradient is formed on the top surface in the bubble-generating section through the variation of the material, thickness or density of the film. However, in practical application, the first substrate 230/330/430 with the recess 231/331/431 can be formed by disc manufacturing process. Compared to the conventional method of manufacturing the first substrate by MEMS technology, the present invention significantly reduces the manufacturing cost, increases the production speed and further improves the yield rate.

Figure 7:
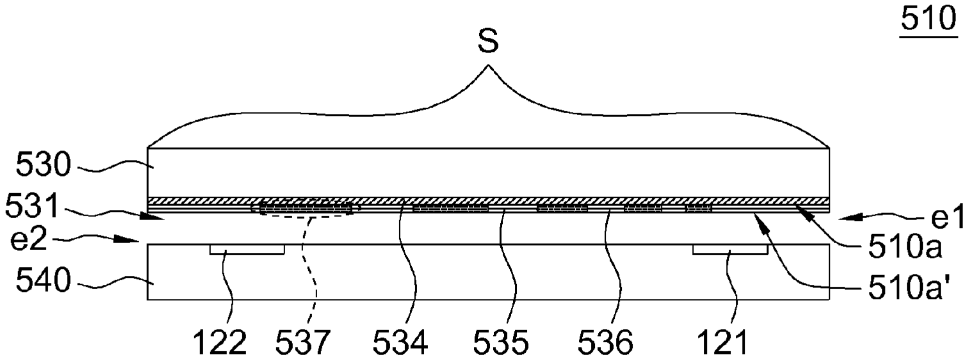
FIG. 7 is a side view of the micro-channel according to the second embodiment of the present invention.

Forming a Surface Energy Gradient on The Top Surface of The Micro-Channel by a Laser Beam Second Embodiment Please refer to FIG. 7. FIG. 7 is a side view of the micro-channel according to the second embodiment of the present invention. In the second embodiment, some regions of a multi-layer film are heated by laser so that the surface energy is varied between the heated region and un-heated region, which causes a surface energy gradient.

In the fabricating method, before the first substrate 530 and the second substrate 540 are bonded to each other, a surface treatment is applied to the first substrate 530 for forming a reflective layer 534 on the top surface 510*a* in the bubble-generating section S. Next, the first film 535 is formed on the reflective layer 534. Then, the second film 536 is formed on the first film 535 for forming a multi-layer film. Later, several regions of the multi-layer film (namely, the first film 535 and the second film 536) in the bubble-generating section S are heated by a laser beam in order to form a complex 537 of the first film 535 and the second film 536. The surface energy in the region heated by the laser beam is different from that in the un-heated region in order to form a surface energy gradient on the top surface 510*a*'. In the present embodiment, the first film 535 and the second film 536 are preferably deposited by sputtering method. However, the present invention is not limited thereto.

Third Embodiment

Figure 8:
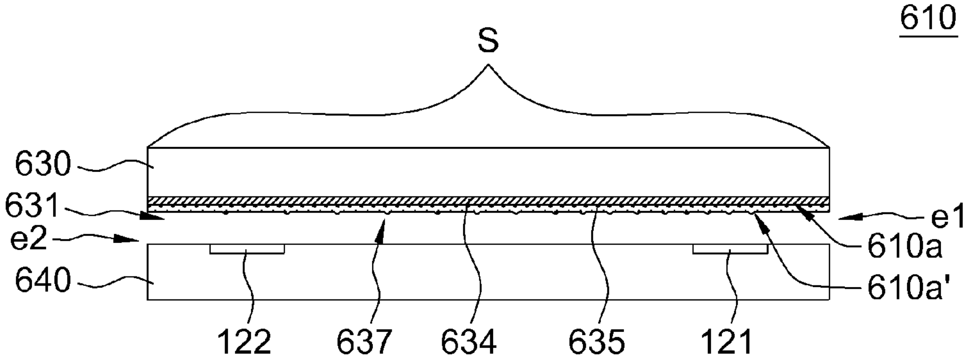
FIG. 8 is a side view of the micro-channel according to the third embodiment of the present invention.

Please refer to FIG. 8. FIG. 8 is a side view of the micro-channel according to the third embodiment of the present invention. In the third embodiment, a substance undergoes chemical changes or foams by a laser beam, which causes the variation of roughness to form a surface energy gradient on the top surface of the micro-channel.

In the fabricating method, a surface treatment is applied to the first substrate 630 before the first substrate 630 and the second substrate 640 are bonded to each other, for forming a reflective layer 634 on the top surface 610*a* in the bubble-generating section S. Next, a mixed film 635 with pressure sensitive adhesive and foaming agent is formed on the reflective layer 634. Then, several regions of the bubble-generating section S is heated by a laser beam so that several foaming protruding parts 637 are formed in the heated region. In the present embodiment, the protruding parts 637 heated by a laser beam has different surface energy from the un-heated region, which forms a surface energy gradient on the top surface 610'.

Furthermore, different materials can be used selectively. For example, a mixed film 635 with pressure sensitive adhesive and dye is formed on the reflective layer 634 and heated by a laser beam. Several concaves are formed in the heated regions. Similarly, the concaves heated by the laser beam has different surface energy from the un-heated region, which forms a surface energy gradient on the top surface 610'

Similar to the first embodiment, the first substrate 530/630 with the recess 531/631 in the second and third embodiments can be formed through fast and low-cost disc manufacturing process.

Fourth Embodiment

In the first embodiment, the films on the top surface of the micro-channel have different surface energy through sputtering method. In the second and third embodiments, the film is formed first and then a laser beam is used for producing chemical changes to form a surface energy gradient. In the fourth embodiment, several micro-cylinders are formed on the top surface of the micro-channel by laser technology to change the surface roughness of the plane to replace the conventional manufacturing process with high cost and complicated steps by MEMS technology.

Figure 9A:
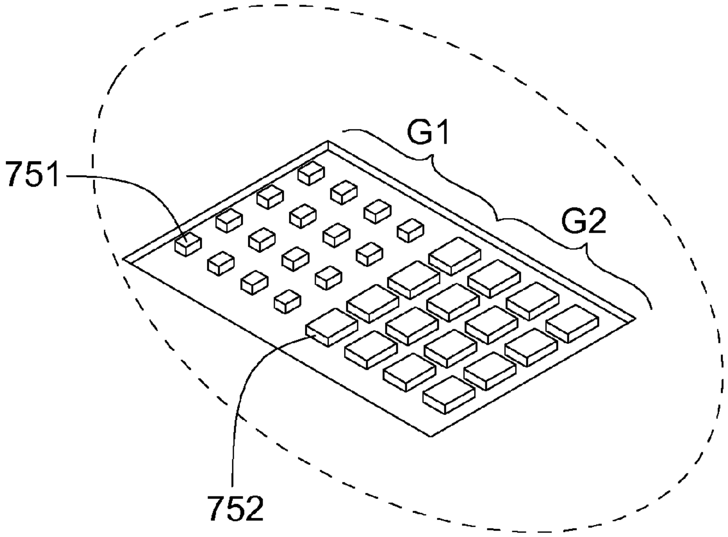
FIG. 9A illustrates several micro-cylinders on the top surface of the micro-channel according to the fourth embodiment of the present invention.
Figure 9B:
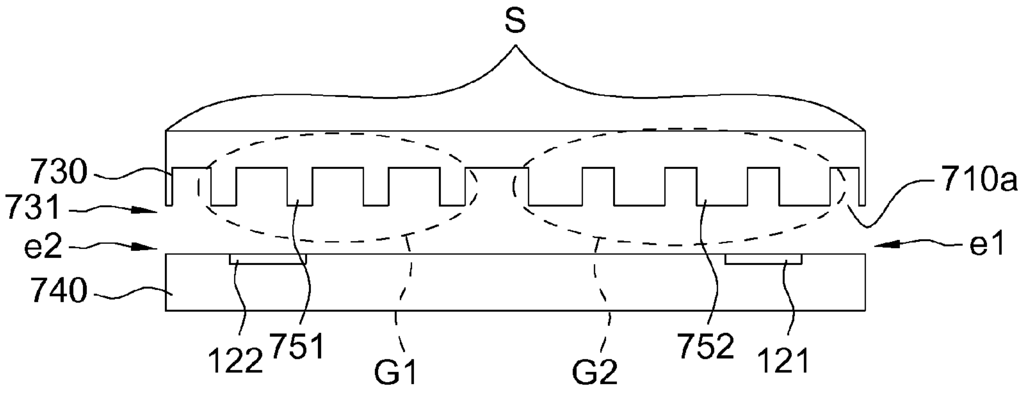
FIG. 9B is a side view of the micro-channel according to the fourth embodiment of the present invention.

Please refer to FIGS. 9A and 9B at the same time. FIG. 9A illustrates several micro-cylinders on the top surface of the micro-channel according to the fourth embodiment of the present invention. FIG. 9B is a side view of the micro-channel according to the fourth embodiment of the present invention.

In the fabricating method, a surface treatment is applied to the first substrate 730 before the first substrate 730 and the second substrate 740 are bonded to each other. The top surface in the bubble-generating section S is sintered by a laser beam for forming several micro-cylinders. The micro-cylinders change the surface roughness of the top surface 710*a*, which forms a surface energy gradient on the top surface 710*a'*.

As shown in FIGS. 9A and 9B, the first cylinder group G1 and the second cylinder group G2 are formed on the first substrate 730 (such as a silicon substrate) and respectively corresponding to the two regions of the first substrate 730. The first cylinder group G1 includes several first micro-cylinders 751 with the same cross-sectional area. The area proportion of the first cylinder group G1 determines the first roughness factor ψ1. The second cylinder group G2 includes several second micro-cylinders 752 with the same cross-sectional area, and the cross-sectional area of the second micro-cylinders 752 is greater than that of the first micro-cylinders 751. Similarly, the area proportion of the second cylinder group G2 determines the second roughness factor ψ2. The first roughness ψ1 is different from the second roughness factor ψ2 because the first micro-cylinders 751 and the second micro-cylinders 752 have different cross-sectional area, which forms a surface energy gradient on the top surface 710*a'*.

In FIGS. 9A and 9B, the first cylinder group G1 and the second cylinder group G2 respectively include the first micro-cylinders 751 with less cross-sectional area and the second micro-cylinders 752 with larger cross-sectional area. However, the present invention is not limited thereto. Several micro-cylinders with the cross-sectional area gradually changing from the front end e1 to the rear end e2 can be formed by a laser beam on the top surface 710*a* of the first substrate 730. As a result, the top surface 710*a* of the channel has rough surface with different roughness factors, which forms a surface energy gradient. Compared to conventional method through MEMS technology, the variation of the surface energy gradient on the top surface 710*a* of the first substrate 730 is formed by a laser beam, which is accurate and fast, and further lowers the manufacturing cost.

In the method of fabricating a bubble-type micro-pump disclosed in the above embodiments of the present invention, the variation of material, density, thickness or surface roughness is formed through laser or sputtering to form a surface energy gradient on the top surface in a bubble-generating section of the micro-channel. Furthermore, in the fabricating method disclosed in the embodiments, the first substrate can be formed through disc manufacturing process, which reduces manufacturing cost and increases production speed and yield rate. Moreover, the first substrate and the second substrate are preferably bonded to each other by pressure sensitive adhesive, so that the defective products can be refabricated and the costly second substrate can be recycled.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a bubble-type micro-pump, comprising:

providing a micro-channel having a top surface, a bottom surface and two side walls, the micro-channel comprising at least a bubble-generating section;

providing a bubble-generating unit in the bubble-generating section of the micro-channel, for generating a bubble in a liquid between a front end and a rear end of the bubble-generating section; and applying a surface treatment to the top surface of the bubble-generating section to form a surface energy gradient on the top surface, so that a difference between a backfilling velocity at the front end and that at the rear end drivers the liquid to flow toward the front end or the rear end;

wherein at least two regions with different surface energies are formed by sputtering form forming the surface energy gradient on the top surface;

wherein a step of forming the surface energy gradient on the top surface comprises:

sputtering a film on the top surface of the bubble-generating section, and the thickness of the film gradually increasing or decreasing from the front end to the rear end; and sputtering the film on the top surface in the bubble-generating section, and the density of the film gradually increasing or decreasing from the front end to the rear end.

2. The method according to claim 1, wherein the step of forming the surface energy gradient on the top surface comprises:

sputtering a first film in a first region on the top surface adjacent to the front end of the bubble-generating section, the first film having a first surface energy; and sputtering a second film in a second region on the top surface adjacent to the rear end of the bubble-generating section, the second film having a second surface energy and connected to the first film, wherein the first surface energy is different from the second surface energy.

3. The method according to claim 1, wherein the step of providing the micro-channels comprises:

providing a first substrate and a second substrate, the first substrate comprising at least a recess having the bubble-generating section; and attaching the first substrate and the second substrate, wherein the surface of the recess forms the top surface and the two walls of the micro-channel, and surface of the second substrate forms the bottom surface of the micro-channel.

4. The method according to claim 3, wherein the step of providing the bubble-generating unit comprises:

disposing a first electrode and a second electrode on the bottom surface in the bubble-generating section, the first electrode and the second electrode respectively adjacent to the front end and the rear end of the bubble-generating section.

5. The method according to claim 3, wherein the first substrate is manufactured by a disc manufacturing process.

6. The method according to claim 3, wherein the first substrate with the recess is manufactured by injection molding, pressure casting or etching.

7. The method according to claim 3, wherein the first substrate and the second substrate are attached by a pressure sensitive adhesive.

* * * * *